United States Patent [19]

Ishikawa et al.

[11] Patent Number: 4,481,276
[45] Date of Patent: Nov. 6, 1984

[54] PHOTOPOLYMERIZABLE COMPOSITION CONTAINING A COMBINATION OF PHOTOINITIATORS

[75] Inventors: Shun-ichi Ishikawa, Shizuoka; Koji Tamoto, Kanagawa; Masayuki Iwasaki; Akira Umehara, both of Shizuoka, all of Japan

[73] Assignee: Fuji Photo Film Co., Ltd., Kanagawa, Japan

[21] Appl. No.: 551,616

[22] Filed: Nov. 14, 1983

[30] Foreign Application Priority Data

Nov. 12, 1982 [JP] Japan ............................ 57-198363

[51] Int. Cl.³ .............................................. G03C 1/68
[52] U.S. Cl. ..................................... 430/281; 430/275; 430/920; 430/922; 204/159.18; 204/159.22
[58] Field of Search ............... 430/275, 281, 920, 922; 204/159.22, 159.18

[56] References Cited

U.S. PATENT DOCUMENTS

| | | | |
|---|---|---|---|
| 3,987,037 | 10/1976 | Bonham et al. | 430/281 |
| 4,189,323 | 2/1980 | Buhr | 430/281 |
| 4,239,850 | 12/1980 | Kita et al. | 430/281 |
| 4,259,432 | 3/1981 | Kondott et al. | 430/281 |
| 4,320,189 | 3/1982 | Taguchi et al. | 430/281 |

*Primary Examiner*—Jack P. Brammer
*Attorney, Agent, or Firm*—Sughrue, Mion, Zinn, Macpeak and Seas

[57] ABSTRACT

A photopolymerizable composition having an improved sensitivity, which comprises a polymerizable compound having an ethylenically unsaturated bond and a photopolymerization initiator, wherein said photopolymerization initiator comprises a compound represented by general formula I

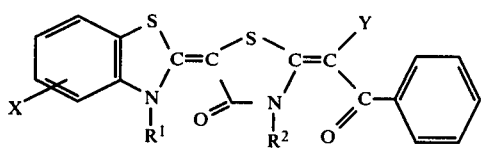

wherein $R^1$ and $R^2$ each represents a hydrogen atom, an alkyl group, a substituted alkyl group, an aryl group, a substituted aryl group, or an aralkyl group; X represents a substituent having a Hammett's value of not more than 0.7; and Y represents a hydrogen atom, an alkyl group, a substituted alkyl group, an aryl group, a substituted aryl group, an aralkyl group, an acyl group, or an alkoxycarbonyl group and a 1,3,5-triazine compound represented by general formula II

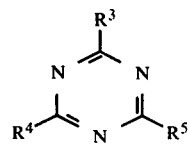

wherein $R^3$, $R^4$, and $R^5$ each represents a hydrogen atom, an alkyl group, a substituted alkyl group, an aryl group, a substituted aryl group, or an aralkyl group; at least one of them being a mono-, di-, or tri-halogen-substituted methyl group.

14 Claims, No Drawings

PHOTOPOLYMERIZABLE COMPOSITION CONTAINING A COMBINATION OF PHOTOINITIATORS

FIELD OF THE INVENTION

This invention relates to a photopolymerizable composition and more particularly to a photopolymerizable composition containing a photopolymerization initiator of a novel composition and capable of responding to, for example, argon laser light.

BACKGROUND OF THE INVENTION

There is well known a process of coating a support with a solution of a photopolymerizable composition composed of a compound having at least one ethylenically unsaturated double bond (hereinafter, the compound is referred to as an ethylenic compound), and a binder having a film-forming faculty, a thermal polymerization preventing agent, a plasticizer, etc., if necessary, to form a photosensitive material having a photopolymerizable composition layer (a photosensitive layer); image-exposing the photosensitive layer based on a desired original to cause a polymerization in the exposed portions and harden the portions; and then treating the photosensitive layer with an organic solvent or an alkali capable of dissolving the unhardened portions only of the photosensitive layer, whereby the unhardened portions are dissolved off to form an image composed of the hardened portions. There is also a well known process of placing under pressure the photosensitive material as described above on other image support (either the support of the photosensitive material or the image support is transparent) to form a laminated material; image-exposing the photosensitive layer from the side of the transparent support to cause a polymerization at the exposed portions of the photosensitive layer, whereby causing a change between the adhesion of the exposed portions to the support of the photosensitive material and the adhesion thereof to the image support, said change in adhesion being different from the relation of adhesion at the unexposed portions; and separating both supports from each other in the state that the unexposed portions of the photosensitive layer are stuck on one support and the exposed portions are on another support to form an image of the photosensitive layer on each support.

In these processes, benzil, benzoin, anthraquinone, or Michler's ketone is used as a photopolymerization initiator. However, the photopolymerization composition using such a photopolymerization initiator is responsive to ultraviolet rays having relatively short wave lengths but has a problem that the photopolymerizable composition is scarcely responsive to ultraviolet rays of long wave lengths and visible rays such as argon laser and does not show a polymerization initiating faculty by such rays. In other words, it is very desirable for image-forming technique to use visible rays as the image exposure light source in the foregoing image formation or laser light as a light source capable of performing a scanning exposure.

As examples of a compound providing a photopolymerizable composition responsive to argon laser light by the combination with a 1,3,5-triazine compound shown by the general formula

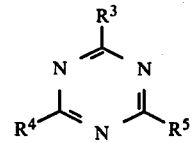

wherein $R^3$, $R^4$, and $R^5$ each represents a hydrogen atom, an alkyl group, a substituted alkyl group, an aryl group, a substituted aryl group, or an aralkyl group; at least one of them being a mono-, di-, or tri-halogen-substituted methyl group, said triazine being used in the present invention, there are 5-[(arenoxazol-2-iridene)ethylidene]-2-thiohydantoin described in Japanese Patent Application (OPI) No. 95,687/79 and 5-[(arenothiazol-2-iridene)ethylidene]-4-oxo-2-thioxazoline described in Japanese Patent Application (OPI) No. 151,024/79.

These compounds may be particularly used as a photopolymerization initiator for photosensitive materials using argon laser as a light source but it is very desirable to discover a photopolymerization initiator having a higher light sensitivity than those of the foregoing compounds so that a laser having a lower output can be used.

SUMMARY OF THE INVENTION

As the result of various investigations under such a circumstance, the inventors have discovered that a photopolymerization initiator having a higher sensitivity is obtained by combining a specific compound with the foregoing 1,3,5-triazine compound shown by the above-described general formula and have attained the present invention based on the discovery.

Thus, the object of this invention is to provide a photopolymerizable composition having a higher sensitivity for argon laser light.

That is, the invention is a photopolymerizable composition comprising a polymerizable compound having an ethylenically unsaturated bond and a photopolymerization initiator comprising a combination of a compound represented by general formula I

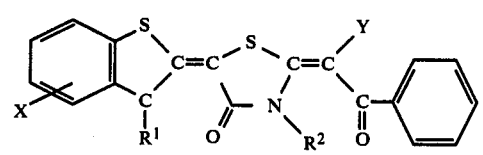

wherein $R^1$ and $R^2$ each represents a hydrogen atom, an alkyl group, a substituted alkyl group, an aryl group, a substituted aryl group, an aralkyl group; X represents a substituent having a Hammett's value of not more than +0.7; and Y represents a hydrogen atom, an alkyl group, a substituted alkyl group, an aryl group, a substituted aryl group, an aralkyl group, an acyl group, or an alkoxycarbonyl group, and a 1,3,5-triazine compound represented by general formula II

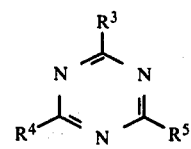

wherein $R^3$, $R^4$, and $R^5$ each represents a hydrogen atom, an alkyl group, a substituted alkyl group, an aryl group, a substituted aryl group, or an aralkyl group; at least one of them being a mono-, di-, or tri-halogen-substituted methyl group.

DESCRIPTION OF THE PREFERRED EMBODIMENT

Now, the photopolymerizable composition of this invention is explained below in detail.

X of the compounds of a group consisting of the 2-(benzoylmethylene)-5-benzothiazolidenethiazole-4-one shown by general formula I and substituted products thereof (hereinafter, these compounds are referred to as benzoylmethylenebenzothiazolidenethiazolones) has a Hammett's value of not more than +0.7 and preferably of a range of −0.9 to +0.5. When the value is larger than 0.7, the mutual electric action between the compound and a triazine compound at an excited state will not be proper, and a photopolymerizable composition having a high sensitivity can not be obtained.

Practical examples of such atoms and groups are a hydrogen atom, a methyl group, an isopropyl group, a tert-butyl group, a phenyl group, a trifluoromethyl group, an acetyl group, an ethoxycarbonyl group, a carboxy group, a carboxylato group (—COOM$^1$, wherein M$^1$ represents H, an alkali metal atom such as Na and K, and NH$_4$ group) an amino group, a methylamino group, a dimethylamino group, an ethylamino group, a diethylamino group, an acetylamino group, —PO$_3$H group, a methoxy group, an ethoxy group, a propoxy group, an isopropoxy group, a butoxy group, a pentyloxy group, a phenoxy group, a hydroxy group, an acetoxy group, a methylthio group, an ethylthio group, an isopropylthio group, a mercapto group, an acetylthio group, a thiocyano group (—SCN), a methylsulfinyl group, an ethylsulfinyl group, a methylsulfonyl group, an ethylsulfonyl group, an aminosulfonyl group, a dimethylsulfonyl group [—S$^⊕$(CH$_3$)$_2$M$^{2⊖}$ wherein M$^{2⊖}$ represents F$^⊖$, Cl$^⊖$, Br$^⊖$, I$^⊖$, RCOO$^⊖$, RSO$_3^⊖$, H$_2$PO$_3^⊖$ or H$_2$PO$_4^⊖$, wherein R represents an alkyl group, a substituted alkyl group, an aryl group or a substituted alkyl group], a sulfonato group (—SO$_3$M$^3$ wherein M$^3$ represents H, an alkali metal atom such as Na and K, and NH$_4$ group), a fluorine atom, a chlorine atom, a bromine atom, an iodine atom, a trimethylsilyl group (—Si(CH$_3$)$_3$), a triethylsilyl group, a trimethylstanyl group (Sn(CH$_3$)$_3$), etc.

Preferred examples of X are a hydrogen atom, a methyl group, an ethyl group, a methoxy group, an ethoxy group, a dimethylamino group, a diethylamino group, a chlorine atom, and a bromine atom.

Examples of the alkyl group shown by $R^1$ and $R^2$ in general formula I include a straight chain and branched chain having 1 to 18 carbon atoms, and cyclic alkyl group having 5 to 10 carbon atoms. Practical examples of the alkyl group are a methyl group, an ethyl group, a propyl group, a butyl group, a pentyl group, a hexyl group, a heptyl group, an octyl group, a nonyl group, a decyl group, a dodecyl group, an octadecyl group, an isopropyl group, an isobutyl group, an isopentyl group, an isohexyl group, a sec-butyl group, a neopentyl group, a tert-butyl group, a tert-pentyl group, a cyclopentyl group, a cyclohexyl group, a cycloheptyl group, a 2-norbornyl group, etc. In these groups, the straight chain and branched chain alkyl groups each having 1 to 10 carbon atoms and the cyclic alkyl groups each having 6 to 10 carbon atoms are preferred. The straight chain and branched chain alkyl groups each having 1 to 4 carbon atoms are most preferred.

Examples of the substituent of the substituted alkyl group shown by $R^1$ and $R^2$ include a halogen atom (fluorine, chlorine, bromine, or iodine) and a hydroxy group. On the other hand, examples of the alkyl group of the substituted alkyl group include a straight chain and branched chain having 1 to 18 carbon atoms and cyclic alkyl group having 5 to 10 carbon atoms, preferably the straight chain and branched chain alkyl groups each having 1 to 10 carbon atoms and the cyclic alkyl group having 6 to 10 carbon atoms, and most preferably the straight chain and branched chain alkyl group each having 1 to 4 carbon atoms. Practical examples of the substituted alkyl group are a chloromethyl group, a bromomethyl group, a 2-chloroethyl group, a 2,2,2-trichloroethyl group, a 2-chloropentyl group, a 1-chloropentyl group, a 1-(chloromethyl)propyl group, a 10-bromodecyl group, a 16-methyloctadecyl group, a chlorocyclohexyl group, a hydroxymethyl group, a 2-hydroxyethyl group, a 2-hydroxybutyl group, a 5-hydroxypentyl group, a 10-hydroxydecyl group, a 2-hydroxyoctadecyl group, a 2-(hydroxymethyl)ethyl group, a hydroxycyclohexyl group, a 3-hydroxy-2-norbornyl group, etc.

Examples of the aryl group shown by $R^1$ and $R^2$ include a residue of one benzene ring (phenyl group), a residue of condensed two or three benzene rings (naphthyl group, anthryl group, or phenathryl group), and a residue of a condensed system of a benzene ring and a 5-membered unsaturated ring (indenyl group, acenaphthenyl group, or fluorenyl group).

Examples of the substituted aryl group shown by $R^1$ and $R^2$ include the foregoing aryl group having at the ring-forming carbon atom or atoms one or two or more substituents, which may be the same or different, such as a halogen atom (e.g., fluorine atom, chlorine atom, bromine atom, and iodine atom), an amino group, a substituted amino group [e.g., monoalkyl-substituted amino group (the alkyl group preferably has 1 to 5 carbon atoms and examples of the alkyl group include methyl group, ethyl group, propyl group, pentyl group, isopropyl group, sec-butyl group, isopropyl group, etc.), dialkylamino group (the alkyl group preferably has 1 to 5 carbon atoms and examples of the alkyl group are same as those of the foregoing monoalkyl-substituted amino group), a monoacylamino group (the acyl group has 2 to 5 carbon atoms and examples of the acyl group include acetyl group, propionyl group, butyryl group, isobutyryl group, valeryl group, etc.)], a cyano group, an alkyl group (e.g., straight chain or branched chain, having 1 to 18 carbon atoms or cyclic alkyl groups preferably having 5 to 10 carbon atoms, preferably straight chain and branched chain alkyl groups having 1 to 10 carbon atoms and cyclic alkyl groups having 6 to 10 carbon atoms, and most preferably straight chain and branched chain alkyl groups having 1 to 4 carbon atoms, practical examples of the alkyl groups are the same as those for R as described above), a halogenoalkyl group preferably having 1 to 5 carbon atoms (e.g., chloromethyl group, 2-chloromethyl group, 5-chloropentyl group, trifluoromethyl group, etc.), an alkoxy group preferably having 1 to 5 carbon atoms (examples of the alkyl group in the alkoxy group include methyl group, ethyl group, butyl group, pentyl group, isopropyl group, isopentyl group, 2-methylbutyl group, sec-butyl group, etc.), an aryloxy group preferably having 6 to 10 carbon atoms (examples of the aryl group in the aryloxy group include phenyl group, 1-naphthyl group, 2-naphthyl group, etc.), an alkoxycarbonyl group preferably having 1 to 4 carbon atoms (examples of the alkyl group in the alkoxy group include methyl group, ethyl group, propyl group, isopropyl group, butyl group, etc.), an acyloxy group preferably having 2 to 5 carbon atoms (examples of the acyl group are the same as those of the acyl group of the foregoing monoacrylamino group), an alkoxysulfonyl group preferably having 1 to 5 carbon atoms (examples of the alkyl group are same as those of the foregoing alkoxy group), etc.

Practical examples of these aryl groups and substituted aryl groups include a phenyl group, a chlorophenyl group, an aminopnenyl group, a (methylamino)-phenyl group, an(ethylamino)-phenyl group, a (dimethylamino)phenyl group, an acetylaminophenyl group, a tolyl group, an ethylphenyl group, a(chloromethyl)-phenyl group, an acetylphenyl group, a phenoxyphenyl group, a methoxycarbonylphenyl group, an ethoxycarbonylphenyl group, an acetoxyphenyl group, a methoxysulfonylphenyl group, a naphthyl group, a 2-amino-1-naphthyl group, a 1-dimethylamino-2-naphthyl group, a chloronaphthyl group, a methylnaphthyl group, an anthryl group, a phenanthryl group, an indenyl group, a biphenylyl group, a chlorobiphenylyl group, an aminobiphenylyl group, a methylbiphenylyl group, an acenaphthenyl group, etc. In these groups, a phenyl group and a phenyl group substituted by one or two or more foregoing substituents, which may be the same or different in the case of plural substituents, are preferred.

Examples of the aralkyl groups shown by $R^1$ and $R^2$ are the residues of straight chain or branched chain having 1 to 10 carbon atoms, preferably 1 to 6 carbon atoms, or cyclic alkyl groups having 5 to 10 carbon atoms, preferably 6 to 10 carbon atoms, each substituted with a phenyl group or a naphthyl group. Practical examples of the aralkyl group include a benzyl group, a phenethyl group, a 3-phenylpropyl group, a 3-phenylhexyl group, a 10-phenyldecyl group, a 4-phenylcyclohexyl group, a 1-naphthylmethyl group, a 2-(1-naphthyl)ethyl group, a 2-naphthylmethyl group, etc.

Also, examples of Y in general formula I are explained hereinafter.

Preferred carbon numbers and examples of the alkyl group, substituted alkyl group, aryl group, substituted aryl group and an aralkyl group are the same as those illustrated above in regard to $R^1$ and $R^2$.

Examples of the acyl groups shown by Y include the residues of carbonyl groups having bonded thereto a hydrogen atom, a straight chain or branched chain alkyl group having 1 to 10 carbon atoms, preferably 1 to 6 carbon atoms, or cyclic alkyl group having 5 to 10 carbon atoms, preferably 6 to 10 carbon atoms, a phenyl group or a naphthyl group. Practical examples of the acyl group include a formyl group, an acetyl group, a propionyl group, a butyryl group, a valeryl group, a benzoyl group, a naphthoyl group, etc.

Examples of the alkoxycarbonyl groups shown by Y are the residues of oxycarbonyl groups having bonded thereto a straight chain or branched chain alkyl group having 1 to 10 carbon atoms, or cyclic alkyl group having 5 to 10 carbon atoms. Practical examples of the alkoxycarbonyl group include a methoxycarbonyl group, an ethoxycarbonyl group, a propoxycarbonyl group, a butoxycarbonyl group, a sec-butoxycarbonyl group, a tert-butoxycarbonyl group, etc.

The benzoylmethylenebenzothiazolones shown by general formula I can be prepared according to the methods described in "Bull. Soc. Chimie Belges", Vol. 57, 364–372(1948) (abstract: "Chemical Abstracts", Vol. 44, 60e–61d(1950).

Practical examples of the benzoylmethylenebenzothiazolones used in this invention are illustrated below.

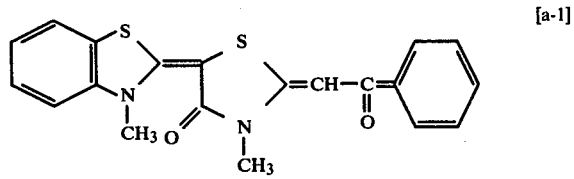

[a-1]

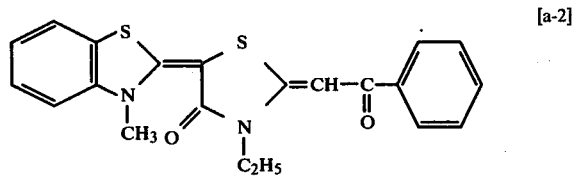

[a-2]

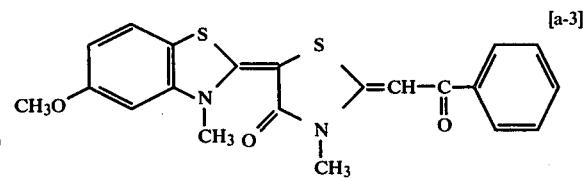

[a-3]

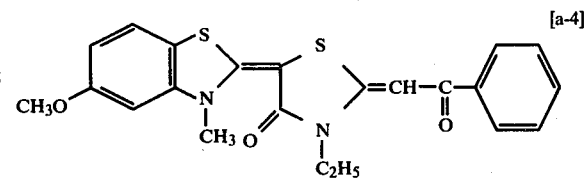

[a-4]

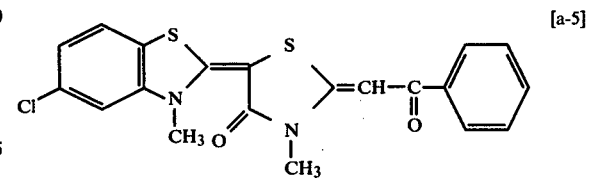

[a-5]

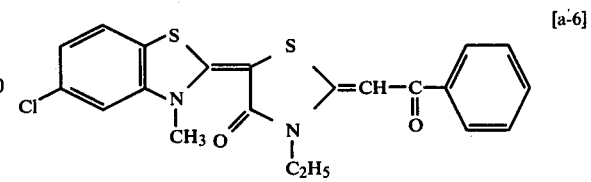

[a-6]

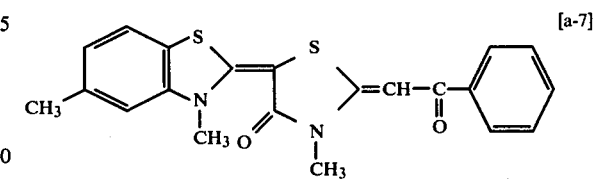

[a-7]

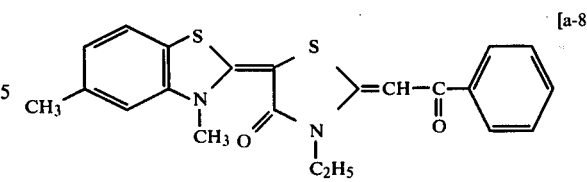

[a-8]

-continued

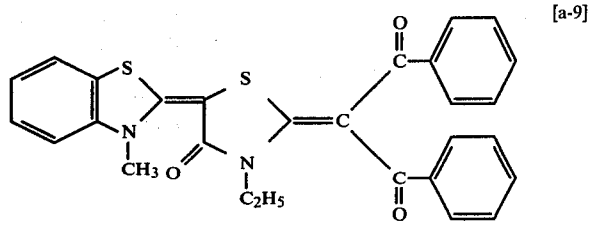
[a-9]

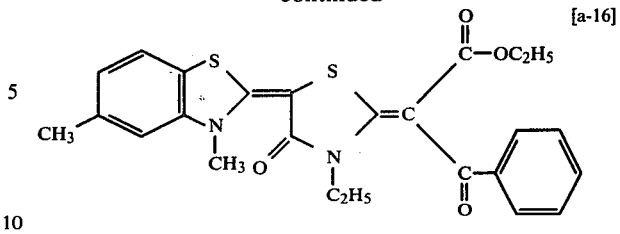
[a-16]

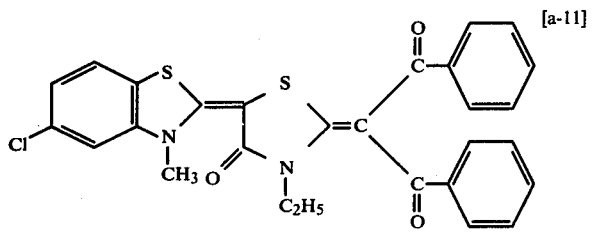
[a-10]

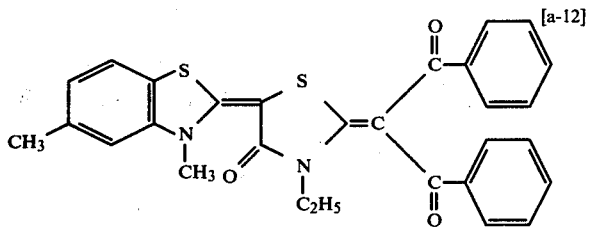
[a-11]

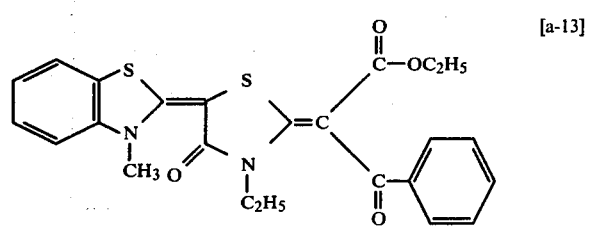
[a-12]

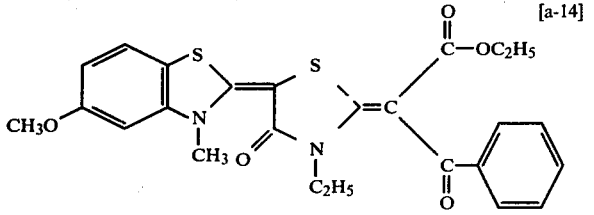
[a-13]

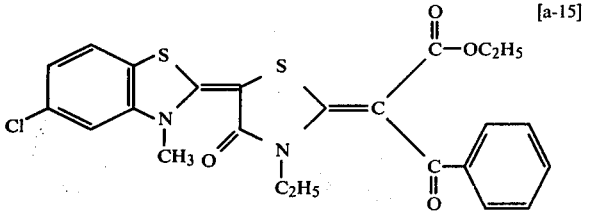
[a-14]

Substituents $R^3$, $R^4$, and $R^5$ of the 1,3,5-triazine compounds shown by general formula II, which may be the same or different, each represents a hydrogen, an alkyl group, a substituted alkyl group, an aryl group, a substituted alkyl group, or an aralkyl group and at least one of these substituents is a mono-, di-, or tri-halogen-substituted methyl group. When $R^3$, $R^4$, and $R^5$ each represents an alkyl group, a substituted alkyl group, an aryl group, a substituted aryl group, or an aralkyl group, these groups have the same significance as the case that X represents an alkyl group, a substituted alkyl group, an aryl group, a substituted aryl group, or an aralkyl group.

Examples of the mono-, di-, or tri-halogen-substituted methyl group include a chloromethyl group, a bromomethyl group, an iodomethyl group, a dichloromethyl group, a dibromomethyl group, a diiodomethyl group, a trichloromethyl group, a tribromomethyl group, and a triiodomethyl group.

The 1,3,5-trizine compounds shown by general formula II can be prepared according to the methods described in "Journal of American Chemical Society"; Vol. 72, 3527–3528(1950) (the T. R. Norton's article entitled "A New Synthesis of Ethyl Trifluoroacetate"); ibid., Vol. 74, 5633–5636(1952) (T. L. Cairns, A. W. Larchar, and B. C. McKaicks' article entitled "The Trimerization of Nitriles at High Pressures"); and Juatus Lieblgs; "Annalen der Chemie", Fol. 577, 77–95 (1952) (Ch. Geundmann, G. Weiane, and S. Seldes' article entitled "Über Triazine, III Über den Mechanismus der Polymerisation von Nitrilen zu 1,3,5-Triazinen").

Practical examples of the 1,3,5-triazine compounds shown by general formula II include (b-1) 2-methyl-4,6-bis(trichloromethyl)-1,3,5-triazine (the mark in the parenthesis before the compound name is the compound number), (b-2) 2,4,6-tris(trichloromethyl)-1,3,5-triazine, (b-3) 2-methyl-4,6-bis(tribromomethyl)-1,3,5-triazine, (b-4) 2,4,6-tris(tribromomethyl)-1,3,5-triazine, (b-5) 2,4,5-tris(dichloromethyl)-1,3,5-triazine, (b-6) 2,4,6-tris(dibromomethyl)-1,3,5-triazine, (b-7) 2,4,6-tris(bromomethyl)-1,3,5-triazine, (b-8) 2,4,6-tris(chloromethyl)-1,3,5-triazine, (b-9) 2-phenyl-4,6-bis(trichloromethyl)-1,3,5-triazine, (b-10) 2-p-methoxyphenyl)-4,6-bis(trichloromethyl)-1,3,5-triazine, (b-11) 2-phenyl-4,6-bis(tribromomethyl)-1,3,5-triazine, (b-12) 2-(p-chlorophenyl)-4,6-bis(trichloromethyl)-1,3,5-triazine, (b-13) 2-(p-tolyl)-4,6-bis(trichloromethyl)-1,3,5-triazine, etc.

The photopolymerization initiator which is contained in the photopolymerizable composition of this invention as a feature of this invention is composed of a combination of the compound shown by general formula I and the compound shown by general formula II as described above and the weight ratio of the combination of the compounds exhibiting particularly remarkable effect of this invention is from about 1:10 to about 10:1, more preferably from about 1:5 to about 5:1 in the ratio

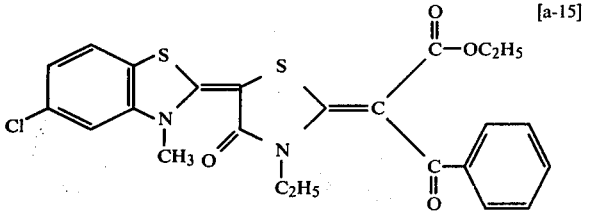
[a-15]

of the compound of formula I: the compound of formula II.

The photopolymerizable composition of this invention contains the photopolymerization initiator usually in a range of about 0.1% to about 20% by weight, preferably about 0.2% to about 10% by weight based on the weight of the ethylenic compound.

The ethylenic compound, i.e., a compound having at least one addition polymerizable ethylenically unsaturated double bond, which is contained in the photopolymerizable composition of this invention as the 1st necessary component, is a component which causes an additional polymerization by the action of the photodecomposition product of the photopolymerization initiator (mixture) which is the 2nd necessary component when the photopolymerizable composition is irradiated by actinic rays and is converted into a high molecular weight polymerized material having a linear or network structure to increase the hardness of the photopolymerizable composition, whereby greatly reducing the solubility of the photopolymerizable composition in an organic solvent and/or inorganic solvent or substantially insolubilizing the composition.

The ethylenic compound is a compound having at least one addition polymerizable ethylenically unsaturated double bond in the molecule and includes a monomer, a prepolymer, i.e., a dimer, a trimer, a tetramer, and an oligomer (a polymer or polycondensation product having a molecular weight of less than about 10,000), a mixture of them, and copolymers thereof having a low polymerization degree.

Examples of the ethylenic compound are unsaturated carboxylic acids, salts thereof, unsaturated carboxylates, esters of unsaturated carboxylic acids and aliphatic polyhydroxy compounds (hereinafter are referred to as aliphatic polyols) or aromatic polyhydric compounds (hereinafter, are referred to as polyhydric phenols), and oligoesters obtained by the ester reaction of a divalent or more polyvalent carboxylic acid, a dihydric or more polyhydric polyhydroxy compound, and an unsaturated carboxylic acid.

When the photopolymerizable composition of this invention is used as a substantially nonfluid composition at normal temperature (in a range of from about 10° C. to about 40° C.), the ethylenic compound having a boiling point of higher than about 100° C. under atmospheric pressure can be used. Also, when the photopolymerizable composition is used as a fluid composition at normal temperature, the ethylenic compound having a boiling point of higher than about 30° C., preferably in a temperature range of from about 40° C. to about 100° C. can be used.

Practical examples of the unsaturated carboxylic acid include acrylic acid, methacrylic acid, itaconic acid, crotonic acid, isocrotonic acid, and maleic acid. As the salts of unsaturated carboxylic acids, there are sodium salts and potassium salts of the foregoing unsaturated carboxylic acids.

Examples of the foregoing aliphatic polyols include dihydric alcohols such as ethylene glycol, triethylene glycol, tetraethylene glycol, tetramethylene glycol, neopentyl glycol, 1,10-decanediol, 1,2-butanediol, 1,3-butanediol, propylenediol, propylene glycol, etc.; trihydric alcohols such as trimethylolethane, trimethylolpropane, etc.; polymers of these dihydric and trihydric alcohols; tetrahydric or more highly polyhydric alcohols such as pentaerythritol, dipentaerythritol, tripentaerythritol, and other polypentaerythritols; saccharides such as sorbitol, d-mannitol, etc.; and dihydroxycarboxylic acids such as dihydroxymaleic acid, etc.

Practical examples of the polyhydric phenol include hydroquinone, catechol, resorcinol, fluoroglycinol, pyrogallol, etc.

Practical examples of the esters of aliphatic polyols and unsaturated carboxylic acids are acrylic acid esters such as diacrylic acid ethylene glycol ester, triacrylic acid triethylene glycol ester, diacrylic acid, 1,3-butanediol ester, diacrylic acid tetramethylene glycol ester, diacrylic acid propylene glycol ester, triacrylic acid trimethylolpropane ester, triacrylic acid trimethylolethane ester, diacrylic acid tetraethylene glycol ester, diacrylic acid pentaerythritol ester, triacrylic acid pentaerythritol ester, tetraacrylic acid pentaerythritol ester, diacrylic acid dipentaerythritol ester, triacrylic acid dipentaerythritol ester, tetraacrylic acid dipentaerythritol ester, pentaacrylic acid dipentaerythritol ester, hexaacrylic acid dipentaerythritol ester, octaacrylic acid tripentaerythritol ester, tetraacrylic acid dipentaerythritol ester, pentaacrylic acid dipentaerythritol ester, hexaacrylic acid dipentaerythritol ester, octaacrylic acid tripentaerythritol ester, triacrylic acid sorbitol ester, tetraacrylic acid sorbitol ester, pentaacrylic acid sorbitol ester, hexaacrylic acid sorbitol ester, polyester acrylic oligomer, etc.; methacrylic acid esters such as dimethacrylic acid tetramethylene glycol ester, dimethacrylic acid triethylene glycol ester, trimethacrylic acid trimethylolpropane ester, trimethacrylic acid trimethlolethyl ester, dimethacrylic acid pentaerythritol ester, trimethacrylic acid pentaerythritol ester, dimethacrylic acid dipentaerythritol ester, dimethacrylic acid pentaerythritol ester, trimethacrylic acid penaerythritol ester, dimethacrylic acid dipentaerythritol ester, tetramethacrylic acid dipentaerythritol ester, octamethacrylic acid tripentaerythritol ester, dimethacrylic acid ethylene glycol ester, dimethacrylic acid 1,3-butanediol ester, dimethacrylic acid tetramethylene grlycol ester, tetramethacrylic acid sorbitol ester, etc.; itaconic acid esters such as diitaconic acid ethylene glycol ester, diitaconic acid propylene glycol ester, diitaconic acid 1,3-butanediol ester, diitaconic acid 1,4-butanediol ester, diitaconic acid tetramethylene glycol ester, diitaconic acid pentaerythritol ester, triitaconic acid dipentaerythritol ester, pentaitaconic acid dipentaerythritol ester, hexaitaconic acid dipentaerythritol ester, tetraitaconic acid sorbitol ester, etc.; crotonic acid esters such as dicrotonic acid ethylene glycol ester, dicrotonic acid propylene glycol ester, dicrotonic acid tetramethylene glycol ester, dicrotonic acid propylene glycol ester, dicrotonic acid pentaerythritol ester, tetracrotonic acid sorbitol ester, etc.; isocrotonic acid esters such as diisocrotonic acid ethylene glycol ester, diisocrotonic acid pentaerythritol ester, tetraisocrotonic acid sorbitol ester, etc.; and maleic acid esters such as dimaleic acid ethylene glycol ester, dimaleic acid triethylene glycol ester, dimaleic acid pentaerythritol ester, tetramaleic acid sorbitol ester, etc. Furthermore, mixtures of the foregoing esters can be also used.

Examples of the foregoing oligoesters include oligoester acrylate and oligoester methacrylate (hereinafter, either one or both of these esters are referred to as simply oligoester (meth)acrylate).

The oligoester (meth)acrylate is the reaction product obtained by the esterification reaction of acrylic acid or methacrylic acid, a polyvalent carboxylic acid, and a polyol, which is estimated to have the structure of general formula III

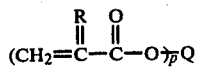

$$(CH_2=\overset{R}{\underset{\|}{C}}-\overset{O}{\underset{\|}{C}}-O)_p Q \qquad \text{III}$$

wherein R represents a hydrogen atom or a methyl group; Q represents an ester residue composed of a polyhydric alcohol and a polyvalent carboxylic acid and having at least one ester bond; and p is an integer of 1 to 6.

Examples of the polyol constituting the ester residue Q include polyols such as ethylene glycol, 1,2-propylene glycol, 1,4-butanediol, 1,6-hexanediol, trimethylolpropane, trimethylolethane, 1,2,6-hexanetriol, glycerol, pentaerythritol, sorbitol, etc., and polyether-type polyols such as diethylene glycol, triethylene glycol, tetraethylene glycol, decaethylene glycol, tetradecaethylene glycol, dipropylene glycol, tripropylene glycol, tetrapropylene glycol, etc.

On the other hand, examples of the polyvalent carboxylic acid constituting the ester residue Q include aromatic polyvalent carboxylic acids such as phthalic acid, isophthalic acid, terephthalic acid, tetrachlorophthalic acid, tetrabromophthalic acid, trimellitic acid, pyromellitic acid, benzophenonedicarboxylic acid, resorcinoldiacetic acid, bisphenol A-diacetic acid, etc.; unsaturated aliphatic polyvalent carboxylic acids such as maleic acid, fumaric acid, itaconic acid, etc.; and saturated aliphatic polyvalent carboxylic acids such as malonic acid, succinic acid, glutaric acid, adipic acid, pimelic acid, sebacic acid, dodecanic acid, tetrahydrophthalic acid, etc.

Ester residue Q includes an ester residue composed of one of the foregoing polyols and one of the foregoing polyvalent carboxylic acids and an ester residue composed of two or more kinds of either group or both groups. Also, an ester residue containing one molecule of the polyol and one molecule of the polyvalent carboxylic acid and an ester residue containing two or more molecules of the polyols and/or polyvalent carboxylic acids are included in ester residue Q. In other words, any ester residue containing at least one ester bond in Q may be used as the ester residue in this invention.

Also, the ester residue Q wherein a hydroxy group remains therein or forms an ester with a monovalent carboxylic acid, or is substituted by an alkoxy group such as methoxy group, ethoxy group, etc., are used in this invention. The ester residue Q wherein a carboxylic group remains may also be used. The number of p in general formula III and the number of the ester number contained in Q are usually in a range of 1 to 6. When the value of p is 2 or more, the polyester (meth)acrylate may contain only either of acryloyl group and methacryloyl group in one molecule or may contain acryloyl group and methacryloyl group in optional ratio in one molecule.

Estimated structures of examples of the oligoester (meth)acrylate are shown in Table 1, wherein Z in the structures represents an acryloyl group

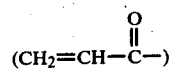

$$(CH_2=CH-\overset{O}{\underset{\|}{C}}-)$$

or methacryloyl group

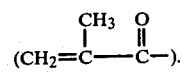

$$(CH_2=\overset{CH_3}{\underset{|}{C}}-\overset{O}{\underset{\|}{C}}-).$$

Furthermore, the unsaturated esters described in U.S. Pat. No. 3,732,107 are also included in the examples of the oligoesters used in this invention.

TABLE 1

Oligoester (meth)acrylate

Z—OCH₂CH₂OOC—CH=CH—COOCH₂CH₂OH

Z—OCH₂CH(CH₃)—OOC—CH₂CH₂—COO—CH(CH₃)CH₂OH

Z—O(CH₂CH₂O)̄ₓOC—C₆H₄—CO(OCH₂CH₂)₂OH
Z(̄O(CH₂)̄ₓOOC(CH₂)̄ₓCO)̄ₓO(CH₂)₄OOC—CH₃
Z—OCH₂CH₂OOC—C₆H₄—COOCH₂CH₂O—Z
Z(̄OCH₂CH₂OOC—C₆H₄—CO)̄ₓOCH₂CH₂O—Z
Z—O(̄CH₂CH₂O)̄ₓOC—CH=CH—CO(̄OCH₂CH₂)̄ₓO—Z

Z—OCH₂CH₂OOC—[norbornane]—COOCH₂CH₂O—Z

Z(̄(OCH₂CH₂)̄ₓOOC—(CH₂)̄ₓCO)̄ₓO(CH₂CH₂O)̄ₓZ
Z(̄(OCH₂CH₂)̄ₓOOC—C₆H₄—CO)̄ₓO(̄CH₂CH₂O)̄ₓZ
Z(̄OCH₂CH₂)̄ₘOOC—CH₂—COO(̄CH₂CH₂O)̄ₘZ

Z(̄OCH₂CH₂)̄ₘOOC—[benzophenone-dicarboxylate]—COO(̄CH₂CH₂O)̄ₘZ

TABLE 1-continued
Oligoester (meth)acrylate
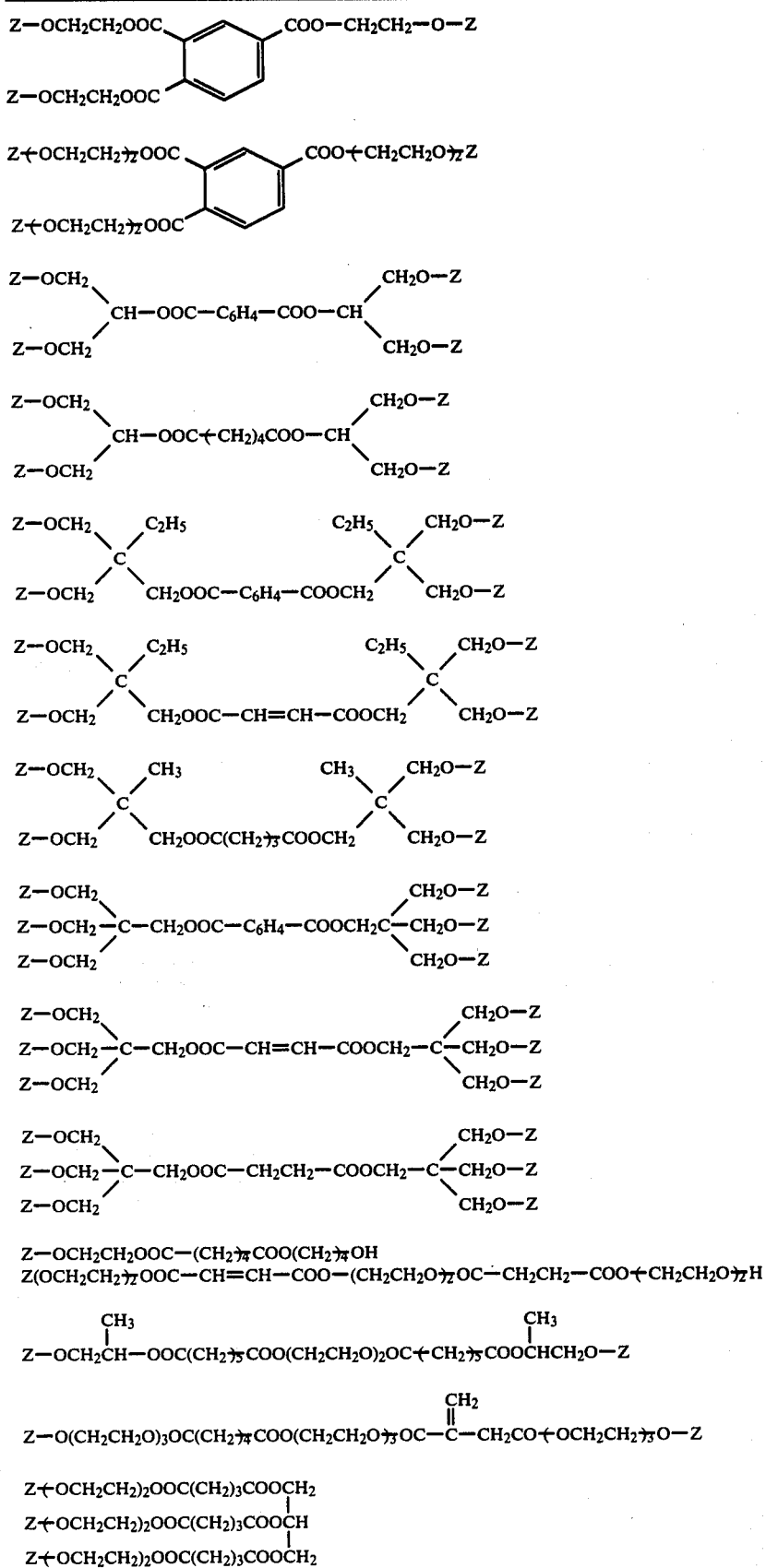

TABLE 1-continued

Oligoester (meth)acrylate $$Z-OCH_2CH_2-OOC-C_6H_4COOCH_2$$
$$Z-OCH_2CH_2-OOC-CH=CH-COOCH_2-C-C_2H_5$$
$$Z-OCH_2CH_2-OOC-CH=CH-COOCH_2$$

$$Z-OCH_2\diagdown\qquad\qquad\qquad\qquad\qquad\qquad\qquad CH_2O-Z$$
$$\qquad CH-OOC-C_6H_4-COO-CH_2CH_2-OOC-C_6H_4-COO-CH$$
$$Z-OCH_2\diagup\qquad\qquad\qquad\qquad\qquad\qquad\qquad CH_2O-Z$$

$$Z-OCH_2\diagdown\qquad\qquad\qquad\qquad\qquad\qquad\qquad\qquad CH_2O-Z$$
$$Z-OCH_2-C-CH_2OOC-CH=CH-COO+CH_2CH_2O)_3OC-CH=CH-COOCH_2-C-CH_2O-Z$$
$$Z-OCH_2\diagup\qquad\qquad\qquad\qquad\qquad\qquad\qquad\qquad CH_2O-Z$$

The photopolymerizable composition of this invention contains the foregoing compound having an ethylenically unsaturated bond and the photopolymerization initiator as the necessary components and usually further contains a binder and other auxiliary additives such as a thermal polymerization inhibitor, a coloring agent, a plasticizer, etc., at practical use.

The binder used in this invention is required to have such properties that the compatibility thereof with the polymerizable ethylenically unsaturated compound and the photopolymerization initiator is good as not causing unmixing in the whole steps for the production of photosensitive materials including the preparation of the coating solution of the composition, coating, and drying the coating solution; the photosensitive layer or resist layer containing the binder together with the photopolymerizable composition can be developed after image exposure by, for example, solution development and peeling development; and also the binder can form a tough film or layer as a photosensitive layer or a resist layer. Such a binder is usually selected from organic linear high molecular weight polymers.

Practical examples of the binder include polyethylene chloride, polypropylene chloride, a polyacrylic acid alkyl ester (examples of the alkyl group include methyl group, ethyl group, n-butyl group, isobutyl group, n-hexyl group, 2-ethylhexyl group, etc.), a copolymer of an acrylic acid alkyl ester (the alkyl group is the same as above) and at least one monomer such as acrylonitrile, vinyl chloride, vinylidene chloride, styrene, butadiene, etc., polyvinyl chloride, a copolymer of vinyl chloride and acrylonitrile, polyvinylidene chloride, a copolymer of vinylidene chloride and acrylonitrile, polyvinyl acetate, polyvinyl alcohol, polyacrylonitrile, a copolymer of acrylonitrile and styrene, a copolymer of acrylonitrile, butadiene, and styrene, a polymethacrylic acid alkyl ester (examples of the alkyl group include methyl group, ethyl group, n-propyl group, n-butyl group, iso-butyl group, n-hexyl group, cyclohexyl group, 2-ethylhexyl group, etc.), a copolymer of a methacrylic acid alkyl ester (the alkyl group is the same as above) and at least one monomer such as acrylonitrile, vinyl chloride, vinylidene chloride, styrene, butadiene, etc., polystyrene, poly-α-methylstyrene, polyamide (6-nylon, 6,6-nylon, etc.), methyl cellulose, ethyl cellulose, acetyl cellulose, polyvinyl formal, polyvinyl butyral, etc.

Moreover, when an organic high molecular polymer soluble in water or an aqueous alkali solution is used as the binder, the photosensitive layer or resist layer containing the binder can be developed by water or an aqueous alkali solution. As such a high molecular polymer, there are addition polymers each having a carboxylic acid at the side chain, such as a methacrylic acid copolymer (e.g., a copolymer of methyl methacrylate and methacrylic acid, a copolymer of ethyl methacrylate and methacrylic acid, a copolymer of butyl methacrylate and methacrylic acid, a copolymer of benzyl methacrylate and methacrylic acid, a copolymer of ethyl methacrylate and methacrylic acid, a copolymer of methacrylic acid and styrene, etc.) an acrylic acid copolymer (e.g., a copolymer of ethyl acrylate and acrylic acid, a copolymer of butyl acetate and acrylic acid, a copolymer of ethyl acrylate, styrene, and acrylic acid, etc.), an itaconic acid copolymer, a crotonic acid copolymer, a partially esterified maleic acid copolymer, etc. Moreover, acid cellulose derivatives each having a carboxylic acid at the side chain can be also used as the binder.

These high molecular polymers may be used solely or two or more kinds of the high molecular polymers each having a good compatibility with each other as not causing unmixing during the production processes of the photosensitive materials including the preparation of the coating solution, coating and drying can be used as the binder at a proper mixing ratio.

The molecular weight of the high molecular polymer used as the binder can be selected in a wide range according to the kind of the polymer but is generally 5,000 to 2,000,000, preferably 10,000 to 1,000,000.

The binder may be used usually in an amount of up to 90% by weight based on the total amount (excluding a solvent) of the photopolymerizable composition.

Practical examples of the thermal polymerization inhibitor used in this invention include p-methoxyphenol, hydroquinone, alkyl- or aryl-substituted hydroquinone, t-butylcatecohl, pyrogallol, phenothiazine, chloranil, naphthylamine, β-naphthol, 2,6-di-t-butyl-p-cresol, pyridine, nitrobenzene, dinitrobenzene, p-toluidine, etc. The thermal polymerization inhibitor may be incorporated in the photopolymerizable composition of this invention usually in a range of from about 0.001% to about 5% by weight, preferably from about 0.01% to about 3% by weight based on the weight of the ethylenic compound. The thermal polymerization inhibitor has a function of improving the stability of the photopolymerizable composition of this invention before use (before exposure).

Examples of the coloring agent used in this invention include pigments such as titanium oxide, carbon black, iron oxide, pigments such as phthalocyanine series pigments, azo series pigments, etc., and dyes such as Methylene Blue, Crystal Violet, Rhodamine B, Fucsnine, Auramine, azo dyes, anthraquinone dyes, etc. In this case, it is preferred that the coloring agent used does not absorb light of absorption wave length of the photopolymerizing initiator.

It is preferred that the amount of the coloring agent incorporated in the photopolymerizable composition be 0.1 part by weight to 30 parts by weight for pigment and 0.01 part by weight to 10 parts by weight, preferably 0.1 part by weight to 3 parts by weight for dye per 100 parts by weight of the sum of the ethylenic compound and the binder.

Examples of the plasticizer used in this invention include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diallyl phthalate, etc.; glycol esters such as dimethyl glycol phthalate, ethylphthalylethyl glycolate, methylphthalylethyl glycolate, butylphthalylbutyl glycolate, triethylene glycol dicaprylic acid ester, etc.; phosphoric acid esters such as tricresyl phosphate, triphenyl phosphate, etc.; aliphatic dibasic acid esters such as diisobutyl adipate, dioctyl adipate, dimethyl sebacate, dibutyl sebacate, dioctyl azelate, dibutyl maleate, etc.; triethyl citrate; glucerol triacetyl ester; butyl laurate, etc.

The plasticizer may be used usually in a range of up to 200 parts by weight, preferably up to 50 parts by weight based on 100 parts by weight of a polymerizable compound in the composition.

in a most general method of using the photopolymerizing composition of this invention, the photopolymerizable composition is dissolved in a solvent to form a solution of the composition, the solution is coated on a support by a known manner, and then the solvent is removed (by drying) to provide a photosensitive material.

Examples of the solvent used in this case include ketones such as acetone, methyl ethyl ketone, methyl isobutyl ketone, cyclohexanone, diisobutyl ketone, etc.; esters such as ethyl acetate, butyl acetate, amyl acetate, methyl formate, ethyl propionate, dimethyl phthalate, ethyl benzoate, etc.; aromatic hydrocarbons such as toluene, xylene, benzene, ethylbenzene, etc.; halogenated hydrocarbons such as carbon tetrachloride, trichloroethylene, chloroform, 1,1,1-trichloroethane, monochlorobenzene, chloronaphthalene, etc.; ethers such as tetrahydrofuran, diethyl ether, ethylene glycol monomethyl ether, ethylene glycol monomethyl ether acetate, etc.; dimethylformamide; dimethyl sulfoxide, etc.

As a support to which the photopolymerizable composition of this invention is applied in a proper state (e.g., as a solution as described above), there are a plane-like material and a material having other form, which do not cause severe dimensional deformation. Examples of materials from which a plate can be formed include glass, silicon oxide, ceramics, papers, metals such as aluminum, zinc, magnesium, copper, iron, chromium, nickel, silver, gold, platinum, palladium, an aluminum-base alloy, a zinc-base alloy, a magnesium-blue alloy, a copper-base alloy, an iron-nickel-chromium alloy, a copper-zinc alloy, etc., metal compounds such as aluminum oxide, tin oxide ($SnO_2$), indium oxide ($In_2O_3$), etc., and polymers such as regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonate of Bisphenol A, polyethylene, polypropylene, nylon (6-nylon, 6,6-nylon, 6,10-nylon, etc.), polyvinyl chloride, a copolymer of vinyl chloride and vinyl acetate, a copolymer of vinyl chloride and acrylonitrile, a copolymer of vinyl chloride and vinylidene chloride, polyacrylonitrile, polymethyl acrylate, polymethyl methacrylate, etc. Also, a solidly laminated material of two or more thin plates of the foregoing materials, such as cermet, an iron-aluminum laminate plate, an iron-copper-aluminum laminate plate, an iron-chromium-copper laminate plate, a polyethylene-coated paper, a cellulose triacetate-coated paper, an aluminum plate having an aluminum oxide layer on the surface thereof formed by anodically oxidizing the surface thereof, a chromium plate having a chromium oxide layer formed by a known method; a glass plate having an indium oxide layer, and a silicon oxide plate having an indium oxide layer on the surface thereof may be used.

The support may be transparent or opaque according to the purpose of the photosensitive image-forming material. In the case of using a transparent support, the transparent support may be not only colorless but also colored by adding thereto a dye or pigment as described in "J. SMPTE"; Vol. 67, 296 (1958). In the case of an opaque support, there are not only originally opaque materials such as papers and metals but also an opaque material prepared by adding a pigment such as titanium oxide, etc., to a transparent material, a plastic film the surface of which is treated by the method described in Japanese Patent Publication No. 19,068/72, a paper or plastic film which is rendered light-shielding by the addition of carbon black. Further, a metallic support having a roughened surface formed by graining, electrolytic etching, anodic oxidation, chemical etching, etc., and a support the surface of which is pre-treated by corona discharging, ultraviolet irradiation, flame treatment, etc., can be also used. Moreover, a plastic support reinforced by the addition of glass fibers, carbon fibers, boron fibers, metal fibers, metal whiskers, etc., may be also used.

If necessary, on the surface of the support may be formed other layer necessary for facilitating bonding of the photosensitive layer or an antihalation layer, an ultraviolet absorption layer, a visible ray adsorption layer, etc.

Also, for preventing the reduction of the sensitivity of the photosensitive layer by the action of oxygen, the photosensitive layer may be exposed using a vacuum printing flame as described in U.S. Pat. No. 3,060,026, a transparent cover which can be removed may be formed on the photosensitive layer, or a layer having less permeability for oxygen may be formed on the photsensitive layer as described in Japanese Patent Publication No. 17,828/65 (corresponding to British Pat. No. 1,001,833).

The factors of determining the rates of photopolymerizing, oxidizing, and drying the photopolymerizable composition of this invention include the property of a support, in particular the surface of the support, specific components of the composition, the content of the photopolymerization initiator in the whole photopolymerizable composition, the thickness of the layer of the photopolymerizable composition, the property (characteristics of the emission spectra) and intensity of a light source, the presence of oxygen, and the environmental temperature.

The irradiation of light may be performed any desired one of various methods or by a combination of them. In other words, the photosensitive layer of the photopolymerizable composition of this invention may be exposed to actinic rays obtained from any type of light source if the light source gives an effective exposure amount. This is because the photopolymerizable composition of this invention generally shows the maximum sensitivity at an ultraviolet and visible region of wave lengths of from about 180 n.m. to about 600 n.m. However, since the photopolymerizable composition of this invention also has a sensitivity for electromagnetic waves of short wave lengths in the ranges of vacuum ultraviolet rays (ultraviolet rays in a wave length region of from about 1 n.m. to about 190 n.m.), X rays, gamma rays and also for particle rays of electron rays, neutron rays, and $\alpha$ rays, such rays may also be used for image exposure. Examples of a proper light source having an ultraviolet and visible wave length region are a carbon arc lamp, a mercury vapor lamp, a zenon lamp, a fluorescent lamp, an argon glow discharging tube, a photographic flood lamp, and a van de Graaff accelerator.

The light irradiation (image exposure) time must be sufficient for giving an effective light amount to the photopolymerizable composition of this invention. The compositions of this invention hardened by the irradiation of light are dry and elastic materials which show abrasion resistance and chemical resistance, have ink acceptability, a hydrophilic-hydrophobic equilibrium, anti-staining property, an initial roll up property (printing number until practically usable prints can be obtained), etc., and, are in particular applicable to pre-sensitized lithographic printing plates and photo-resists. The photopolymerizable compositions of this invention are as a matter of course used as printing ink; adhesives for metal foils, films papers, fabrics, etc.; light hardenable dyes for metals, plastics, papers, woods, metal foils, fabrics, glasses, cardboards, thickpapers for making boxes, etc., as well as marks of roads, parking places, and air ports.

When the photopolymerizable composition of this invention is used as a vehicle for printing ink, the composition may be colored by conventional dyes or organic pigments, for example, molybdate orange, titanium white, chromium yellow, phthalocyanine blue, carbon black, etc. The amount of the vehicle used for the purpose is usually from about 20% to 99.9% by weight of the total weight of the composition and also the amount of the coloring agent used for the vehicle is usually from about 0.1% to 80% by weight. Printing materials include papers, clay-coated papers, and thick papers for making boxes.

The composition of this invention is further suitable for the treatment of fabrics made by natural fibers or synthetic fibers. For example, the composition can be used in a vehicle for fabric printing ink or a vehicle used for specific treatment for imparting water resistance, oil resistance, anti-staining property, anti-creasing property, etc., to fabrics.

When the composition of this invention is used as adhesives, at least one of substrates to be stuck must be transparent to ultraviolet rays of visible rays. Typical examples of the laminated materials obtained by adhering substrates using the composition of this invention as adhesives are cellophane coated with a polymer such as polypropylene, a metal such as aluminum or copper coated with a polyethylene tetraphthalate film, and aluminum coated with polypropylene.

The photopolymerizable composition of this invention can be used as a coating material which is coated or printed on the surface of glass or a plastic by a roller system or a spray system. Also, in the case of applying the composition to a glass, a polyester film, a vinyl polymer film, a polymer-coated cellophane or a treated or untreated polyethylene or polypropylene used for, for example, disposable cups or bottles, etc., a coloring coating system may be employed. Metals coated with the composition include sized or non-sized tin plates.

A photopolymerizable photosensitive image-forming material preparing using the photopolymerizable composition of this invention is the material having the layer composed of the composition of this invention as a photosensitive layer on a sheet-like or plate-like support.

In one embodiment of the photosensitive image-forming material using the composition of this invention, the layer of the composition of this invention is formed on the surface of a support and then a transparent plastic film is further formed on the layer. The image-forming material of the construction may be used by separating the transparent plastic film directly before image exposure described hereinafter or can be particularly advantageously used as a so-called peel off development type photosensitive material that the photosensitive layer is image-exposed through the transparent plastic film or, when the support is transparent, through the support without removing the transparent plastic film and thereafter, the transparent plastic film is separated, whereby leaving the portion of the layer polymerized and hardened by exposure on the support and the unexposed and unhardened portion of the layer on the transparent plastic film (or leaving the polymerized and hardened portion of the layer on the transparent plastic film and the unexposed and unhardened portion of the layer on the support).

In the photosensitive image-forming material using the composition of this invention, the image exposure is finished by exposing the specific portions of the layer of the photopolymerizable composition to light until the addition polymerization reaction at the light-irradiated portions reaches a desired depth or thickness. Then, the unexposed portion of the layer of the composition is removed by using a solvent which does not dissolve the polymer but dissolves only the ethylenic compound (monomer or oligomer) or by so-called peel off development.

When the photopolymerizable composition is used in a photosensitive image-duplicating material, the thickness of the photopolymerizable composition after removing solvent (i.e., after drying) is usually from about 0.5 $\mu$m to about 150 $\mu$m, preferably from about 2 $\mu$m to about 100 $\mu$m. The flexibility is reduced as the thickness of the layer is increased and the abrasion resistance is reduced as the thickness of the layer is reduced.

When the photopolymerizable composition of this invention is used as a printing ink, a coating composition, or an adhesive, the composition can be used without using a volatile solvent. In these cases, they are superior in various points to conventional oil-containing resinous and solvent-type inks or coating materials.

The photopolymerizable composition of this invention has a feature that the composition shows a higher sensitivity for radiations having wave lengths from about 200 n.m. to about 550 n.m. and hence argon laser light having wave lengths of 488 n.m. and 514.5 n.m. can be used in addition to a high pressure mercury lamp, a super high pressure mercury lamp, a high pressure xenon-mercury lamp, a high pressure xenon lamp, a halogen lamp, a fluorescent lamp, etc., which are usually used for conventional photopolymerizable compositions. Thus, the composition of this invention has excellent properties as compared with conventional photopolymerizable compositions and in particular, a scanning exposure using argon laser light is possible in the case of using the composition of this invention, which greatly increasing the applicable field of the composition. That is, the composition of this invention can be used for photosensitive materials in various fields such as the preparation of printed circuits in electronic industries, the preparation of lithographic or letterpress printing plates, the duplication of optical images, etc.

Then, the examples of this invention and comparison examples are shown below but the invention is not limited to them.

EXAMPLES 1 TO 14 AND COMPARISON EXAMPLES 1 TO 7

(1) Preparation photosensitive material:

Components of photopolymerizable composition (solution)

| | |
|---|---|
| Pentaerythritol tetraacrylate (ethylenic compound) | 40 g |
| Photopolymerization initiator (the compounds shown in Table 2) (the compound of general formula I and the compound of general formula II shown in Table 2 in the examples of this invention and in Table 3 in the comparison examples in the amounts or the amount shown in Note 1) | 4 g |
| Copolymer of benzyl methacrylate and methacrylic acid (73/23 by mol ratio) | 60 g |
| Methyl ethyl ketone | 400 ml |
| Methylcellosolve acetate | 300 ml |

Note 1: When the photopolymerization initiator was composed of a combination of both components, the amount of each component was 2 g and when the initiator was composed of either one component, the amount of the component was 4 g. In Table 3—shows that the compound was not used.

The components shown above were mixed in a vessel for about 3 hours to dissolve solid components and to form a homogeneous solution, the solution thus obtained was coated on an aluminum plate of 0.24 mm thickness, the surface of which was grained and anodically oxidized by ordinary methods, and dried at 80° C. for 10 minutes to provide a photosensitive material. The layer (photosensitive layer) of the photopolymerizable composition after drying was about 10 μm.

(2) Measurement of the sensitivity of photosensitive material:

A transparent polyethylene terephthalate film of 10 μm in thickness was laminated on the photosensitive layer of the photosensitive material obtained in above process (1) and the photosensitive layer was scanned by an argon laser which irradiates a beam of visible light having the wave length of 488 n.m. narrowed by a lens (the beam diameter was 25 μm at the surface of the photosensitive layer) at 10 meters/sec. while changing the amount of light at the surface of the photosensitive layer to 500 mW, 100 mW, 70 mW, 50 mW, 20 mW, 10 mW, 5 mW, and 1 mW, the polyethylene terephthalate film was separated, and the photosensitive material was developed using a developer having the following composition.

Anhydrous sodium carbonate: 10 g
Butyl cellosolve: 5 g
Water: 1 liter

Thus, the minimum scanning amount of the argon laser light capable of forming image was measured. The sensitivity of a photosensitive material is higher as the image is formed by a smaller scanning amount of light.

The results obtained in the above procedures are shown in Table 2 to Table 4 together with photopolymerization initiators are shown by the compound numbers described above.

TABLE 2

| | Photopolymerization initiator | | Scanning amount (mW) of argon laser light necessary for recording |
|---|---|---|---|
| Example | Compound of general formula I | Compound of general formula II | |
| 1 | a-2 | b-2 | 10 |
| 2 | a-2 | b-10 | 50 |
| 3 | a-4 | b-2 | 10 |
| 4 | a-4 | b-10 | 50 |
| 5 | a-8 | b-2 | 5 |
| 6 | a-8 | b-9 | 20 |
| 7 | a-8 | b-10 | 20 |
| 8 | a-8 | b-12 | 10 |
| 9 | a-9 | b-2 | 20 |
| 10 | a-9 | b-10 | 70 |
| 11 | a-10 | b-2 | 10 |
| 12 | a-10 | b-9 | 50 |
| 13 | a-10 | b-10 | 50 |
| 14 | a-10 | b-12 | 20 |

TABLE 3

| | Photopolymerization initiator | | Scanning amount (mW) of argon laser light necessary for recording |
|---|---|---|---|
| Comparison Example | Compound of general formula I | Compound of general formula II | |
| 1 | a-2 | — | >500 |
| 2 | a-8 | — | >500 |
| 3 | a-10 | — | >500 |
| 4 | — | b-2 | >500 |
| 5 | — | b-10 | >500 |

TABLE 4

| | Photopolymerization initiator | | Scanning amount (mW) of argon laser light necessary for recording |
|---|---|---|---|
| Comparison Example | Conventional compound* | Compound of general formula II | |
| 6 | (A)** | b-2 | 100 |
| 7 | (B)*** | b-2 | 100 |

*The compounds described in Japanese Patent Application (OPI) Nos. 95,687/79 and 151,024/79.
**1,3-diethyl-5-[(3'-ethylbenzoxazol-2-iridene)-ethylidene]-2-thiohydantoin.
***5-[(3'-ethyl-2'-benzothiazolidene)ethylidene]-3-ethyl-4-oxo-2-thioxoxazolidine.

What is claimed is:

1. A photopolymerizable composition comprising a polymerizable compound having an ethylenically unsaturated bond and a photopolymerization initiator, wherein said photopolymerization initiator comprises a compound represented by general formula I

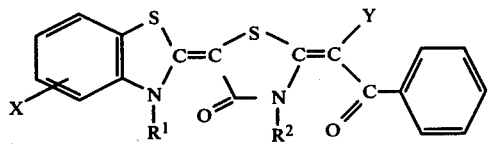

wherein R[1] and R[2] each represents a hydrogen atom, an alkyl group, a substituted alkyl group, an aryl group, a substituted aryl group, or an aralkyl group; X represents a substituent having a Hammett's value of not more than 0.7; and Y represents a hydrogen atom, an alkyl group, a substituted alkyl group, an aryl group, a substituted aryl group, an aralkyl group, an acyl group, or an alkoxycarbonyl group and a 1,3,5-triazine compound represented by general formula II

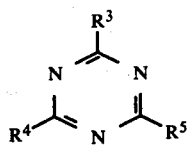

wherein R[3], R[4], and R[5] each represents a hydrogen atom, an alkyl group, a substituted alkyl group, an aryl group, a substituted aryl group, or an aralkyl group; at least one of them being a mono-, di-, or tri-halogen-substituted methyl group.

2. A photopolymerizable composition as claimed in claim 1, wherein X has a Hammett's value of −0.9 to 0.5.

3. A photopolymerizable composition as claimed in claim 1, wherein R[1] and R[2] each represents a hydrogen atom, an alkyl or substituted alkyl group of straight chain or branched chain having 1 to 18 carbon atoms, a cycloalkyl or substituted cycloalkyl group having 5 to 10 carbon atoms, an aryl or substituted aryl group having 6 to 10 carbon atoms or an aralkyl group having an alkyl moiety having 1 to 10 carbon atoms.

4. A photopolymerizable composition as claimed in claim 1, wherein Y represents a hydrogen atom, an alkyl or substituted alkyl group of straight chain or branched chain having 1 to 18 carbon atoms, a cycloalkyl or substituted cycloalkyl group having 5 to 10 carbon atoms, an aryl or substituted aryl group having 6 to 10 carbon atoms, an aralkyl group having an alkyl moiety having 1 to 10 carbon atoms, an acyl group which is a residue of carbonyl group having bonded thereto a hydrogen atom, a straight chain or branched chain alkyl group having 1 to 10 carbon atoms, a cyclic alkyl group having 5 to 10 carbon atoms, a phenyl group or a naphthyl group, or an alkoxycarbonyl group which is a residue having bonded thereto a straight chain or branched chain alkyl group having 1 to 10 carbon atoms or a cyclic alkyl group having 5 to 10 carbon atoms.

5. A photopolymerizable composition as claimed in claim 1, wherein R[3], R[4] and R[5] each represents a hydrogen atom, an alkyl or substituted alkyl group of straight chain or branched chain having 1 to 18 carbon atoms, a cycloalkyl or substituted cycloalkyl group having 5 to 10 carbon atoms, an aryl or substituted aryl group having 6 to 10 carbon atoms or an aralkyl group having an alkyl moiety having 1 to 10 carbon atoms.

6. A photopolymerizable composition as claimed in claim 1, wherein the weight ratio of said compound represented by the general formula I to said compound represented by the general formula II is 1:10 to 10:1.

7. A photopolymerizable composition as claimed in claim 1, wherein said initiator is contained in an amount of 0.1% to 20% by weight based on the weight of the polymerizable compound.

8. A photopolymerizable composition as claimed in claim 1, wherein said polymerizable compound is a compound selected from the group consisting of unsaturated carboxylic acids, salts thereof, unsaturated carboxylates, esters of unsaturated carboxylic acids and aliphatic polyhydroxy compounds or aromatic polyhydric compounds, and oligoesters obtained by the ester reaction of a divalent or more polyvalent carboxylic acid, a dihydric or more polyhydric polyhydroxy compound, and an unsaturated carboxylic acid.

9. A photopolymerizable composition as claimed in claim 1, wherein the composition further contains at least one of a binder, a thermal polymerization inhibitor, a coloring agent and a plasticizer.

10. A photopolymerizable composition as claimed in claim 9, wherein said thermal polymerization inhibitor is contained in an amount of 0.001% to 5% by weight based on the weight of the polymerization compound.

11. A photopolymerizable composition as claimed in claim 9, wherein said coloring agent is contained in an amount of 0.1 part to 30 parts by weight per 100 parts by weight of the sum of the polymerizable compound and the binder.

12. A photopolymerizable composition as claimed in claim 9, wherein said composition further contains a plasticizer in an amount of up to 200 parts by weight based on 100 parts by weight of the polymerizable compound.

13. A photopolymerizable composition as claimed in claim 9, wherein said binder is contained in an amount of up to 90% by weight based on the total amount of the photopolymerizable composition.

14. A photopolymerizable photosensitive material comprising a support having thereon a layer of a photopolymerizable composition comprising a polymerizable compound having an ethylenically unsaturated bond and a photopolymerization initiator, wherein said photopolymerization initiator comprises a compound represented by general formula I

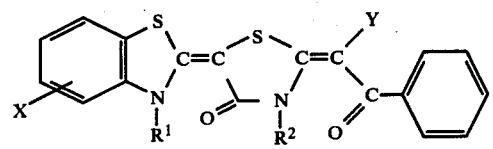

wherein R[1] and R[2] each represents a hydrogen atom, an alkyl group, a substituted alkyl group, an aryl group, a substituted aryl group, or an aralkyl group; X represents a substituent having a Hammett's value of not more than 0.7; and Y represents a hydrogen atom, an alkyl group, a substituted alkyl group, an aryl group, a substituted aryl group, an aralkyl group, an acyl group, or an alkoxycarbonyl group and a 1,3,5-triazine compound represented by general formula II

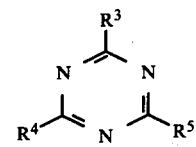

wherein R[3], R[4], and R[5] each represents a hydrogen atom, an alkyl group, a substituted alkyl group, an aryl group, a substituted aryl group, or an aralkyl group; at least one of them being a mono-, di-, or tri-halogen-substituted methyl group.

* * * * *